(12) United States Patent
DeBoer et al.

(10) Patent No.: US 6,677,661 B1
(45) Date of Patent: *Jan. 13, 2004

(54) SEMICONDUCTIVE WAFER ASSEMBLIES

(75) Inventors: Scott Jeffrey DeBoer, Boise, ID (US); John T. Moore, Boise, ID (US); Mark Fischer, Boise, ID (US); Randhir P. S. Thakur, San Jose, CA (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/429,220

(22) Filed: Oct. 28, 1999

Related U.S. Application Data

(62) Division of application No. 09/057,153, filed on Apr. 7, 1998.

(51) Int. Cl.[7] .............................................. H01L 23/58
(52) U.S. Cl. ....................................... 257/649; 257/640
(58) Field of Search ................................ 257/637, 638, 257/640, 649, 760

(56) References Cited

U.S. PATENT DOCUMENTS

| | | |
|---|---|---|
| 3,549,411 A | 12/1970 | Bean et al. |
| 3,649,884 A | 3/1972 | Haneta |
| 3,884,698 A | 5/1975 | Kakihama et al. ........... 117/217 |
| 4,075,367 A | 2/1978 | Gulett |
| 4,330,569 A | 5/1982 | Gulett et al. ................... 427/38 |
| 4,439,270 A | 3/1984 | Powell et al. |
| 4,446,194 A | 5/1984 | Candelaria et al. |

(List continued on next page.)

FOREIGN PATENT DOCUMENTS

| | | |
|---|---|---|
| GB | 2129217 A | 5/1984 |
| GB | 2145243 A | 3/1985 |

(List continued on next page.)

OTHER PUBLICATIONS

U.S. patent application Ser. No. 09/031,251, filed Feb. 1998, Lam et al. class 257 subclass 640.*
Wolf, S., "Silicon Processing for the VLSI Era", vol. 1: Process Technology, Lattice Press 1986, pp. 191–193.

(List continued on next page.)

Primary Examiner—Amir Zarabian
Assistant Examiner—Pamela Perkins
(74) Attorney, Agent, or Firm—Wells St. John P.S.

(57) ABSTRACT

In one aspect, the invention includes a semiconductor fabrication process, comprising: a) providing a substrate; b) forming a layer of silicon nitride over the substrate, the layer having a thickness; and c) enriching a portion of the thickness of the silicon nitride layer with silicon, the portion comprising less than or equal to about 95% of the thickness of the layer of silicon nitride. In another aspect, the invention includes a semiconductor fabrication process, comprising: a) providing a substrate; b) forming a layer of silicon nitride over the substrate, the layer having a thickness; and c) increasing a refractive index of a first portion of the thickness of the silicon nitride layer relative to a refractive index of a second portion of the silicon nitride layer, the first portion comprising less than or equal to about 95% of the thickness of the silicon nitride layer. In yet another aspect, the invention includes semiconductor wafer assembly, comprising: a) a semiconductor wafer substrate; and b) a layer of silicon nitride over the substrate, the layer comprising a thickness and two portions elevationally displaced relative to one another, a first of the two portions having less resistance than a second of the two portions, the first portion comprising less than or equal to about 95% of the thickness of the silicon nitride layer.

21 Claims, 2 Drawing Sheets

U.S. PATENT DOCUMENTS

| | | |
|---|---|---|
| 4,485,553 A | 12/1984 | Christian et al. |
| 4,499,656 A | 2/1985 | Fabian et al. ............. 29/576 E |
| 4,543,707 A | 10/1985 | Ito et al. |
| 4,612,629 A | 9/1986 | Harari |
| 4,695,872 A | 9/1987 | Chatterjee |
| 4,698,787 A | 10/1987 | Mukherjee et al. |
| 4,732,858 A | 3/1988 | Brewer et al. |
| 4,868,632 A | 9/1989 | Hayashi et al. |
| 4,874,716 A | 10/1989 | Rao |
| 4,939,559 A | 7/1990 | DiMaria et al. |
| 4,996,081 A | 2/1991 | Ellul et al. ................... 427/96 |
| 5,041,888 A | 8/1991 | Possin et al. |
| 5,045,345 A | 9/1991 | Singer ......................... 427/38 |
| 5,045,847 A | 9/1991 | Tarui et al. ................. 340/783 |
| 5,098,865 A | 3/1992 | Machado et al. |
| 5,160,998 A | 11/1992 | Itoh et al. |
| 5,178,016 A | 1/1993 | Dauenhauer et al. |
| 5,219,788 A | 6/1993 | Abernathey et al. ........ 437/187 |
| 5,304,829 A | 4/1994 | Mori et al. |
| 5,306,946 A | 4/1994 | Yammoto |
| 5,442,223 A | 8/1995 | Fujii |
| 5,489,542 A | 2/1996 | Iwai et al. ................... 437/41 |
| 5,518,946 A | 5/1996 | Kuroda ........................ 437/52 |
| 5,523,616 A | 6/1996 | Den |
| 5,554,418 A | 9/1996 | Ito et al. ..................... 427/579 |
| 5,587,344 A | 12/1996 | Ishikawa |
| 5,756,404 A | 5/1998 | Friedenreich et al. |
| 5,773,325 A | 6/1998 | Teramoto |
| 5,795,821 A | 8/1998 | Bacchetta et al. |
| 5,831,321 A * | 11/1998 | Nagayama ................. 257/412 |
| 5,834,374 A | 11/1998 | Cabral, Jr. et al. |
| 5,877,069 A | 3/1999 | Robinson |
| 5,882,978 A | 3/1999 | Srinivasan et al. |
| 5,891,793 A | 4/1999 | Gardner et al. |
| 5,904,523 A | 5/1999 | Feldman et al. |
| 5,918,147 A | 6/1999 | Filipiak et al. |
| 5,925,494 A | 7/1999 | Horn |
| 5,926,739 A * | 7/1999 | Rolfson et al. ............. 438/763 |
| 5,985,771 A | 11/1999 | Moore et al. |
| 6,093,956 A | 7/2000 | Moore et al. |
| 6,103,619 A | 8/2000 | Lai |
| 6,140,181 A | 10/2000 | Forbes et al. |
| 6,143,627 A | 11/2000 | Robinson |
| 6,143,662 A * | 11/2000 | Rhoades et al. ............ 438/690 |
| 6,265,241 B1 | 7/2001 | Pan |
| 6,300,253 B1 | 10/2001 | Moore et al. |
| 6,417,559 B1 | 7/2002 | Moore et al. |
| 2001/0013638 A1 * | 8/2001 | Lam et al. ................... 257/640 |

FOREIGN PATENT DOCUMENTS

| | | |
|---|---|---|
| GB | 2170649 A | 8/1986 |
| JP | 362137854 | 6/1987 |
| JP | 401086562 | 3/1989 |
| JP | 403075158 | 3/1991 |

OTHER PUBLICATIONS

Mayer, J. et al., "Electronic Materials Science: For Integrated Circuits in Si and GaAs", Macmillian Pub. Co. 1990, pp. 269–274.

Abstract: Kanicki, J. et al., "Intrinsic Stress in Silicon Nitride and Silicon Dioxide Films Prepared by Various Deposition Techniques", 1988 IEEE Internatl. Sympos. on Elect. Insulation, Boston, MA (Jun. 5–8, 1988), 1 page.

Chang, E. et al., "Passivation of GaAs FETs with PECVD Silicon Nitride Films of Different Stress States", IEEE Transactions on Electron Devices, vol. 35, No. 9 (Sep. 1988), pp. 1412–1418.

Kovac, Z. et al. "Silicon Nitride Overcoats for Thin Film Magnetic Recording Media", IEEE Transactions on Magnetics, vol. 27, No. 6, (Nov. 1991), pp. 5070–5072.

U.S. patent application Ser. No. 09/057,155, John T. Moore, filed Apr. 7, 1998.

U.S. patent application Ser. No. 08/567,090, Rolfson et al.

Wolf, S., "Silicon Processing For The VLSI Era", vol. 1, pp. 177–178.

Wolf, S., "Silicon Processing For The VLSI Era", vol. 2, pp. 37–38, 598–599.

* cited by examiner

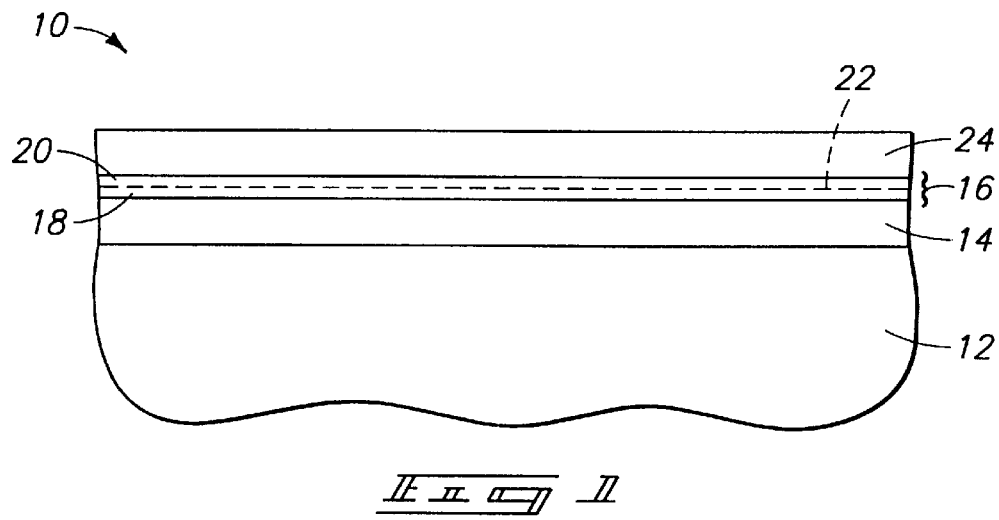
_Fig. 1_
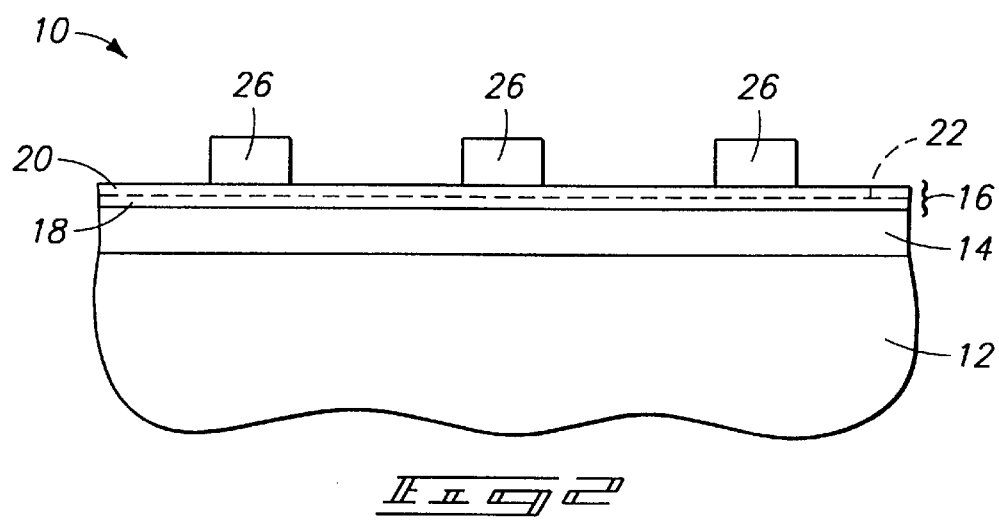
_Fig. 2_
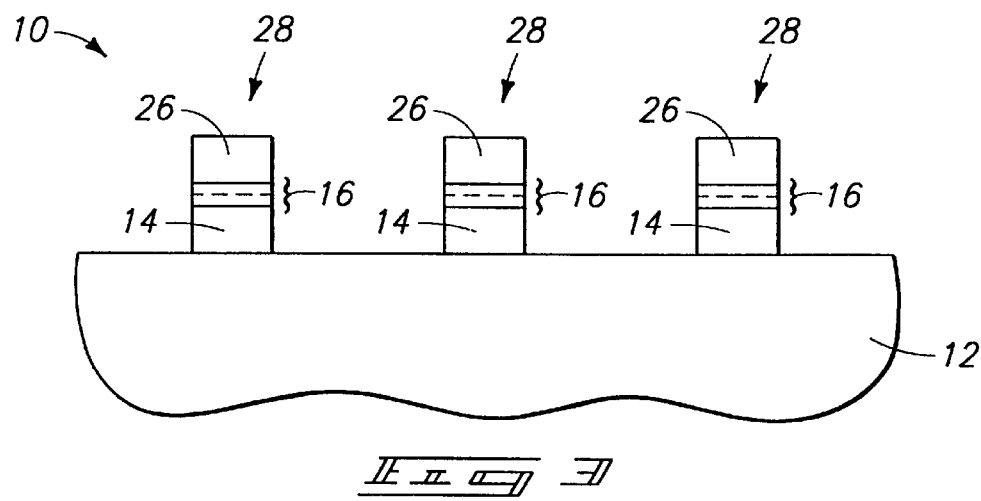
_Fig. 3_

SEMICONDUCTIVE WAFER ASSEMBLIES

RELATED PATENT DATA

This patent resulted from a divisional application of U.S. patent application Ser. No. 09/057,153, which was filed on Apr. 7, 1998.

TECHNICAL FIELD

The invention pertains to silicon nitride layers and to methods of forming silicon nitride layers. Additionally, the invention pertains to photolithography and etching.

BACKGROUND OF THE INVENTION

Silicon nitride has many applications in modern semiconductor devices, as well as in modern semiconductor device fabrication processes. For instance, silicon nitride is electrically insulating, and is frequently utilized as a dielectric layer to separate electrically conductive circuit components. Additionally, silicon nitride is selectively etchable to other materials frequently used in semiconductor fabrication processes, such as, for example, polysilicon and silicon dioxide, and therefore makes an effective etch stop during etching of such other materials. It would be desirable to develop methods for altering chemical properties of silicon nitride to vary its insulative properties and etch properties for suitability to particular applications.

In addition to the above-discussed applications in which silicon nitride is commonly utilized, there are a number of semiconductor processing applications for which silicon nitride is not considered appropriate, or has less than desired attributes, for example, $Si_3N_4$ often requires discrete antireflective coating layers intermediate it and an overlying photoresist layer. Accordingly, $Si_3N_4$ does not have very good inherent antireflective properties. Antireflective coatings are utilized during photolithographic processing of photoresist layers to absorb light passing through the photoresist layers. Antireflective coatings can thereby prevent light from being reflected from beneath the photoresist layer to constructively and/or destructively interfere with other light propagating through the photoresist layer.

Although $Si_3N_4$ generally requires discrete antireflective coating layers intermediate it and an overlying photoresist layer, silicon enriched silicon nitride layers (i.e., silicon nitride layers having a greater concentration of silicon than $Si_3N_4$, such as, for example, $Si_4N_4$) frequently do not. However, silicon enriched silicon nitride is difficult to pattern due to a resistance of the material to etching. Silicon enriched silicon nitride layers are formed to have a substantially homogenous composition throughout their thicknesses, although occasionally a small portion of a layer (1% or less of a thickness of the layer) is less enriched with silicon than the remainder of the layer due to inherent deposition problems.

It would be desired to develop alternative methods of utilizing silicon nitride in wafer fabrication processes. As silicon nitride is relatively ubiquitous in semiconductor processing methods, it would be convenient if methods could be developed wherein the silicon nitride could function as an antireflective coating, and yet could also be relatively easily subsequently patterned.

SUMMARY OF THE INVENTION

In one aspect, the invention encompasses a method of forming a silicon nitride layer. A first portion of a silicon nitride layer is formed, and a second portion of the silicon nitride layer is formed. One of the first and second portions has a greater stoichiometric amount of silicon than the other of the first and second portions. The one portion comprises less than or equal to about 95% of a thickness of the layer of silicon nitride.

In another aspect, the invention encompasses a semiconductor fabrication process. A substrate is provided. A layer of silicon nitride is formed over the substrate. The silicon nitride layer has a thickness. A refractive index of a first portion of the thickness of the silicon nitride layer is increased relative to a refractive index of a second portion of the silicon nitride layer. The first portion comprises less than or equal to about 95% of the thickness of the silicon nitride layer.

In yet another aspect, the invention encompasses a semiconductor wafer assembly. The assembly includes a semiconductor wafer substrate and a layer of silicon nitride over the substrate. The silicon nitride layer comprises a thickness and two portions elevationally displaced relative to one another. A first of the two portions has less resistance than a second of the two portions, and comprises less than or equal to about 95% of the thickness of the silicon nitride layer.

BRIEF DESCRIPTION OF THE DRAWINGS

Preferred embodiments of the invention are described below with reference to the following accompanying drawings.

FIG. 1 is a diagrammatic, fragmentary, cross-sectional view of a semiconductor wafer fragment at a preliminary step of a fabrication process of the present invention.

FIG. 2 is a view of the FIG. 1 wafer fragment shown at a processing step subsequent to that of FIG. 1.

FIG. 3 is a view of the FIG. 1 wafer fragment shown at a processing step subsequent to that of FIG. 2.

DETAILED DESCRIPTION OF THE PREFERRED EMBODIMENTS

Figure 4:
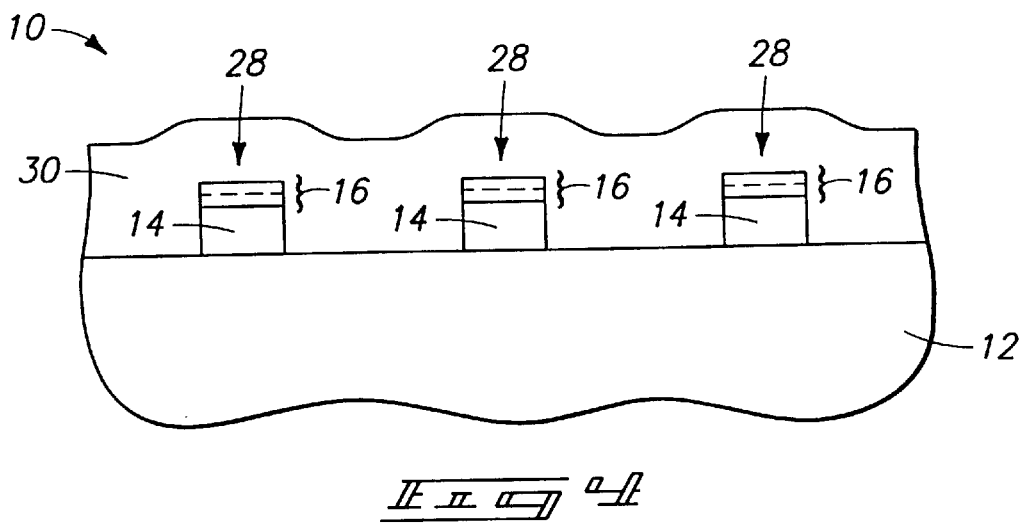
FIG. 4 is a view of the FIG. 1 wafer fragment shown at a processing step subsequent to that of FIG. 3.

This disclosure of the invention is submitted in furtherance of the constitutional purposes of the U.S. Patent Laws "to promote the progress of science and useful arts" (Article 1, Section 8).

The invention encompasses silicon nitride layers comprising at least two portions. One of the at least two portions is a first portion and another is a second portion. The first portion has a greater stoichiometric amount of silicon than the second portion. Preferably, the first portion comprises less than or equal to about 95% of a thickness of the layer of silicon nitride, more preferably it comprises less than or equal to about 30% of said thickness, and most preferably it comprises from about 10% to about 30% of said thickness. The silicon enriched first portion of the layer silicon nitride can comprise, for example, at least 10% more silicon than the less enriched second portion. As another example, the silicon enriched first portion can comprise at least 35% more silicon than then less enriched second portion. The relative orientation of the first and second portions can vary depending on the application of the silicon nitride layer. Accordingly, the first portion can be formed either above, below, or beside the second portion.

An example method of forming the above-described silicon nitride layer is a chemical vapor deposition (CVD)

process utilizing a silicon precursor gas (for example SiH$_2$Cl$_2$ (dichlorosilane)) and a nitrogen precursor gas (for example, NH$_3$ (ammonia)). A substrate is provided within a CVD reaction chamber, together with a first ratio of the silicon precursor gas to the nitrogen precursor gas. One of the first and second portions of the silicon nitride layer is then deposited. Subsequently, the ratio of the silicon precursor gas to the nitrogen precursor gas is altered and the other of the first and second portions of the silicon nitride layer is deposited. Exemplary processing conditions for the CVD process include a pressure of from about 100 mTorr to about 1 Torr, and a temperature of from about 700° C. to about 800° C.

In an exemplary process of forming a silicon nitride layer in which the less enriched second portion is to be formed first, and in which the silicon precursor is dichlorosilane and the nitrogen precursor is ammonia, the initial ratio of the silicon precursor gas to the nitrogen precursor gas is about 0.33. Such ratio forms second portion of the silicon nitride layer having a stoichiometry of about Si$_3$N$_4$. After depositing the Si$_3$N$_4$, the ratio of silicon precursor gas to nitrogen precursor gas is increased to, for example, about 6 to form a silicon enriched first portion of the silicon nitride layer. The silicon enriched first portion has a stoichiometry of Si$_x$N$_y$, wherein the ratio of x to y is greater than or equal to 1. The silicon enriched first portion can comprise, for example, Si$_4$N$_4$, Si$_7$N$_4$, Si$_{10}$N$_1$, or, if the flow of nitrogen precursor gas is effectively ceased, Si.

In the above-described example process, the ratio of silicon precursor gas to nitrogen precursor gas utilized to form the first portion is about 18 times greater than that utilized to form the second portion. Preferably, the ratio of silicon precursor gas to nitrogen precursor gas utilized for formation of a silicon enriched portion of a silicon nitride layer will be at least about 15 times greater than that utilized for formation of a less silicon enriched portion.

The respective depositions of the first and second portions of the silicon nitride layer preferably occur in a common and uninterrupted deposition process. By "common deposition process" it is meant a deposition process wherein a wafer is not removed from a reaction chamber between the time that an initial portion of a silicon nitride layer is formed and the time that a final portion of the silicon nitride layer is formed. By "uninterrupted deposition process" it is meant a process wherein the flow of at least one of a silicon precursor gas and a nitrogen precursor gas does not stop during the deposition process.

A silicon nitride layer having a portion more enriched with silicon than another portion can be better suited for a number of uses than the prior art silicon nitride layers. For instance, the susceptibility of a silicon nitride layer to etching, particularly wet etching, generally decreases as the silicon nitride layer becomes more enriched with silicon. Accordingly, a heavily silicon enriched portion of a silicon nitride layer will generally function as a better etch stop then will a less enriched portion of the silicon nitride layer. By having both heavily silicon enriched portions and less enriched portions present within the same silicon nitride layer, the location of the heavily silicon enriched portion can be precisely adjusted within the silicon nitride layer to adjust the location of the etch stop. Also, the removability of the silicon nitride layer can be adjusted. Specifically, silicon nitride layers having a higher proportion of less silicon enriched portions to heavily silicon enriched portions can be easier to remove in subsequent wafer processing. Example etch conditions which proceed slower with respect to an silicon enriched silicon nitride relative to a silicon nitride having a lower stoichiometric amount of silicon are etching in hot phosphoric acid, or etching in dilute hydrofluoric acid (wherein "dilute" refers to a hydrofluoric acid solution comprising less than 50% hydrofluoric acid (by weight)).

Additionally, it is found that a portion of a silicon nitride layer having a higher silicon enrichment has a greater refractive index than a portion having a lower stoichiometric amount of silicon. As discussed in the "background" section of this disclosure, silicon nitride is not utilized as an anti-reflective coating because conventional silicon nitride layers have too low of a refractive index. Specifically, conventional silicon nitride (Si$_3$N$_4$) has refractive index of less than 2. In contrast, a silicon-enriched portion of a silicon nitride layer can have a refractive index of 2.2, or greater. Example refractive indexes for varying stoichiometries of silicon nitride are listed in Table 1.

TABLE 1

| Refractive Index | Approximate Stoichiometry of Silicon Nitride Layer |
| --- | --- |
| less than 2.0 | Si$_3$N$_4$ |
| about 2.2 | Si$_4$N$_4$ |
| about 2.5 | Si$_7$N$_4$ |
| about 3.0 | Si$_{10}$N$_1$ |
| about 3.5 | SiN$_0$ |

As can be seen in Table 1, a greater stoichiometric amount of silicon within a silicon nitride layer leads to a higher refractive index of the layer. Silicon nitride layers having refractive indices of 2.2 or greater can be utilized as anti-reflective coatings.

It is also found that a conductivity of a silicon nitride layer can be adjusted by adjusting silicon enrichment within the layer. Specifically, higher silicon enrichment leads to greater conductivity within a silicon nitride layer. Provision of a heavily silicon enriched portion of a silicon nitride layer over a less silicon enriched portion of the silicon nitride layer can effectively provide a conductive channel within the silicon nitride layer. Specifically, the heavily silicon enriched portion of the nitride layer is the conductive channel, and it can be electrically insulated from adjacent conductive components by the less silicon enriched portion of the nitride layer.

An example processing method incorporating a silicon nitride layer of the present invention is described with reference to FIGS. 1–5. Referring to FIG. 1, a semiconductor wafer fragment 10 comprises a substrate 12 and a first material layer 14 over substrate 12. Substrate 12 can comprise, for example, monocrystalline silicon lightly doped with a p-type dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

First material layer 14 is a layer which is ultimately to be covered with silicon nitride and patterned. Layer 14 can comprise, for example, silicon dioxide, such as utilized in local oxidation of silicon (LOCOS) to grow field oxide regions. As another example, material 14 can comprise polysilicon, such as utilized during formation of conductive lines. If layer 14 comprises silicon dioxide for LOCOS, it will typically be much thinner relative to silicon nitride layer 16 than shown in FIG. 1. Specifically, the silicon dioxide will be utilized as a pad oxide to protect substrate 12 from stress induced by silicon nitride layer 16, and will have a thickness that is less than about one-half of the thickness of silicon nitride layer 16.

A silicon nitride layer 16 is formed over first material layer 14. Silicon nitride layer 16 comprises an innermost portion 18 and an outermost portion 20 elevationally displaced from portion 18. An interface between portions 18 and 20 is illustrated in FIG. 1 as dashed line 22. One of portions 18 and 20 is more heavily enriched with silicon then is the other of the portions. In a preferred embodiment, outermost portion 20 comprises a higher stoichiometric amount of silicon then innermost portion 18. This permits outermost portion 20 to function as both an antireflective surface and an etch-stop layer. The portion 18 having a lower stoichiometric amount of silicon enables silicon nitride layer 16 to be more readily removed by etching methods than it would be if an entirety of the layer were formed of the heavily silicon enriched silicon nitride.

A layer of photoresist 24 is formed over silicon nitride layer 16. Preferably, no antireflective coating layer is formed between silicon nitride layer 16 and photoresist layer 24.

Referring to FIG. 2, photoresist layer 24 is patterned to form photoresist blocks 26. Patterning of photoresist layer 24 comprises exposing photoresist layer 24 to a patterned light beam to render portions of photoresist layer 24 more soluble in a solvent than the portions which ultimately form blocks 26. During the exposure to the light, silicon nitride layer 16 functions as an antireflective surface. In prior art processes, a separate antireflective coating would typically have been formed between silicon nitride layer 16 and photoresist layer 24. The method of the present invention can eliminate the need for such separate antireflective coating layer.

After the exposure to the light, photoresist layer 24 is exposed to the solvent to selectively remove portions of layer 24 and leave photoresist blocks 26.

Referring to FIG. 3, a pattern is transferred from photoresist blocks 26 to layers 14 and 16. The pattern is transferred by etching layers 14 and 16. Such etch can comprise, for example, a plasma-enhanced etch utilizing $NF_3$ and HBr. After the pattern is transferred, layers 14 and 16 comprise stacks 28.

Referring to FIG. 4, photoresist blocks 26 are removed from over stacks 28 and a second material layer 30 is formed over substrate 12 and over stacks 28. In applications in which first material 14 is to be utilized for formation of conductive lines, second material 30 can comprise an insulative material, such as, for example, silicon dioxide. The insulative material can electrically isolate conductive lines 14 from one another. In applications in which stacks 28 are utilized for LOCOS, there would typically be no deposition of a second material 30. Instead, portions of substrate 12 between stacks 28 would be oxidized to grow field oxide regions.

Figure 5:
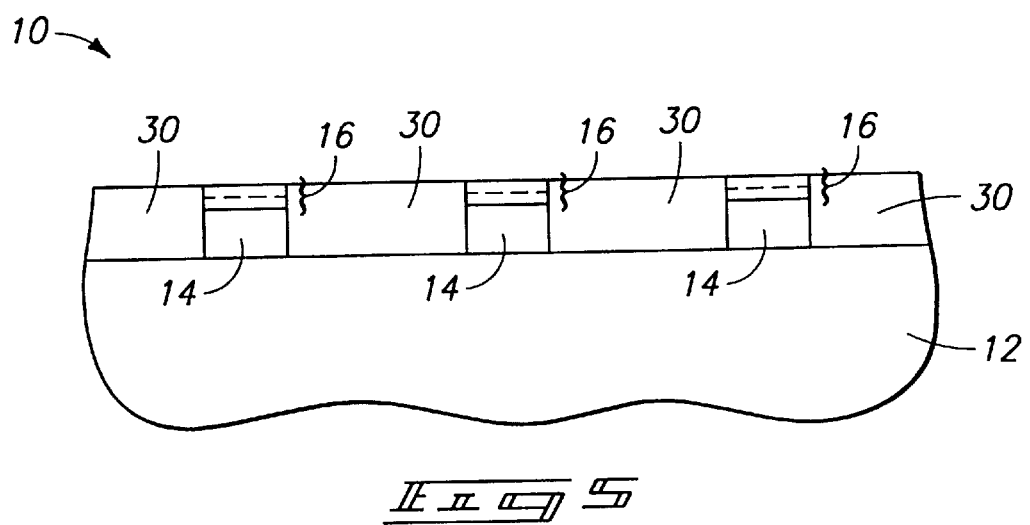
FIG. 5 is a view of the FIG. 1 wafer fragment shown at a processing step subsequent to that of FIG. 4.

Referring to FIG. 5, second layer 30 is planarized, such as, for example, by chemical-mechanical polishing. During the planarization of second material layer 30, silicon nitride layers 16 function as etch stops.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductive wafer assembly comprising:
   a semiconductive wafer substrate;
   a mass of silicon dioxide over and physically against the substrate;
   a layer of silicon nitride over and physically against the mass of silicon dioxide, the layer comprising a thickness and two portions elevationally displaced relative to one another and contacting one another one of the portions having a greater stoichiometric amount of silicon than the other portion, the one portion comprising from about 10% to less than or equal to about 95% of the thickness of the layer of silicon nitride; and
   a mass of photoresist over and physically against the layer of silicon nitride.

2. The semiconductive wafer assembly of claim 1 wherein the one portion is between the other portion and the substrate.

3. The semiconductive wafer assembly of claim 1 wherein the other portion is between the one portion and the substrate 4. The semiconductive wafer assembly of claim 1 wherein the one portion comprises less than or equal to about 30% of the thickness of the layer of silicon nitride.

5. The semiconductive wafer assembly of claim 1 wherein the one portion comprises from about 10% to about 30% of the thickness of the layer of silicon nitride.

6. The semiconductive wafer assembly of claim 1 wherein the one portion comprises at least one of $Si_4N_4$, $Si_7N_4$ and $Si_{10}N_1$.

7. The semiconductive wafer assembly of claim 1 wherein the one portion comprises $SiN_0$.

8. The semiconductive wafer assembly of claim 1 wherein the stoichiometric amount of silicon in the one portion is at least 10% greater than the stoichiometric amount of silicon in the other portion.

9. The semiconductive wafer assembly of claim 1 wherein the stoichiometric amount of silicon in the one portion is at least 35% greater than the stoichiometric amount of silicon in the other portion.

10. The semiconductive wafer assembly of claim 1 wherein the refractive index of the one portion is at least about 10% greater than the refractive index of the other portion.

11. The semiconductive wafer assembly of claim 1 wherein the refractive index of the one portion is at least about 25% greater than the refractive index of the other portion.

12. The semiconductive wafer assembly of claim 1 wherein the refractive index of the one portion is at least about 50% greater than the refractive index of the other portion.

13. A semiconductive wafer assembly comprising:
    a semiconductive wafer substrate;
    a mass of silicon dioxide over and physically against the substrate; and
    a layer of silicon nitride over and physically against the mass of silicon dioxide, the layer comprising two portions disposed beside each other, one of the portions having a greater stoichiometric amount of silicon than the other portion.

14. The semiconductive wafer assembly of claim 13 further comprising a mass of photoresist over and physically against at least a portion of the layer of silicon nitride.

15. The semiconductive wafer assembly of claim 13 wherein the one portion comprises at least one of $Si_4N_4$, $Si_7N_4$ and $Si_{10}N_1$.

16. The semiconductive wafer assembly of claim 13 wherein the one portion comprises $SiN_0$.

17. The semiconductive wafer assembly of claim 13 wherein the stoichiometric amount of silicon in the one portion is at least 10% greater than the stoichiometric amount of silicon in the other portion.

18. The semiconductive wafer assembly of claim 13 wherein the stoichiometric amount of silicon in the one portion is at least 35% greater than the stoichiometric amount of silicon in the other portion.

19. The semiconductive wafer assembly of claim 13 wherein the refractive index of the one portion is at least about 10% greater than the refractive index of the other portion.

20. The semiconductive wafer assembly of claim 13 wherein the refractive index of the one portion is at least about 25% greater than the refractive index of the other portion.

21. The semiconductive wafer assembly of claim 13 wherein the refractive index of the one portion is at least about 50% greater than the refractive index of the other portion.

* * * * *